United States Patent

Harada et al.

[11] Patent Number: 5,096,749
[45] Date of Patent: Mar. 17, 1992

[54] METHOD OF PRODUCING A METALLIZATION LAYER STRUCTURE

[75] Inventors: Shigeki Harada, Kawasaki; Masahiro Sugimoto, Yokosuka, both of Japan

[73] Assignee: Fujitsu Limited, Kanagawa, Japan

[21] Appl. No.: 588,862

[22] Filed: Sep. 27, 1990

Related U.S. Application Data

[62] Division of Ser. No. 235,595, Aug. 24, 1988, Pat. No. 4,980,239.

[30] Foreign Application Priority Data

Aug. 27, 1987 [JP] Japan ................ 62-213319

[51] Int. Cl.$^5$ .............................. B05D 1/36
[52] U.S. Cl. ................... 427/404; 156/656; 204/192.1; 427/255.4; 427/255.7; 427/376.1; 427/383.3; 427/419.7; 428/420; 428/698; 428/699
[58] Field of Search .......... 427/376.1, 383.3, 404, 427/419.1, 419.7, 255.4, 255.7; 428/420, 552, 698, 699; 156/656; 204/192.1; 501/96, 153

[56] References Cited

U.S. PATENT DOCUMENTS

| | | | |
|---|---|---|---|
| 2,798,577 | 7/1957 | Forge, Jr. | 428/552 |
| 2,996,401 | 8/1961 | Welch et al. | 427/106 |
| 3,057,445 | 10/1962 | Bronnes | 428/552 |
| 3,107,756 | 10/1963 | Gallet | 428/552 |
| 4,461,799 | 7/1984 | Gavrilov et al. | 428/210 |
| 4,503,130 | 3/1985 | Bosshart et al. | 428/632 |
| 4,611,745 | 9/1986 | Nakahashi et al. | 228/122 |
| 4,695,517 | 9/1987 | Okuno et al. | 428/699 |
| 4,761,345 | 8/1988 | Sato et al. | 428/552 |
| 4,770,953 | 9/1988 | Horiguchi et al. | 428/699 |
| 4,818,626 | 4/1989 | Werdecker et al. | 427/376.6 |

FOREIGN PATENT DOCUMENTS 2187205 9/1987 United Kingdom .

OTHER PUBLICATIONS

Chemical Abstracts, vol. 107, No. 20, Abstract No. 182020q, Nov. 1987, p. 382.

Primary Examiner—Shrive Beck
Assistant Examiner—Terry J. Owens
Attorney, Agent, or Firm—Armstrong, Nikaido, Marmelstein, Kubovcik & Murray

[57] ABSTRACT

A metallization layer structure containing, in order, an aluminum nitride ceramic base layer, an aluminum titanium nitride layer, a titanium layer, a heat-resistant metallic layer and a metallic layer for facilitating soldering and brazing. The aluminum titanium nitride layer is formed at the interface between the aluminum nitride ceramic base layer and the titanium layer by subjecting a laminate containing, in order, an aluminum nitride ceramic base layer, a titanium layer, a heat-resistant metallic layer and a metallic layer for facilitating soldering and brazing to a heat treatment within the range of 350°–1000° C. for 40 minutes.

12 Claims, 8 Drawing Sheets

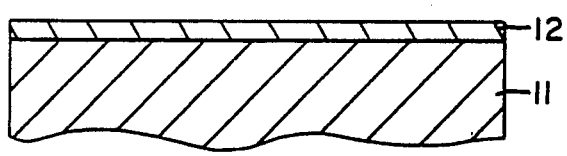
FIG.IA
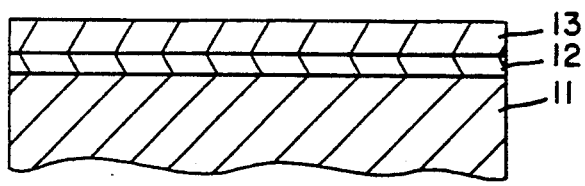
FIG.IB
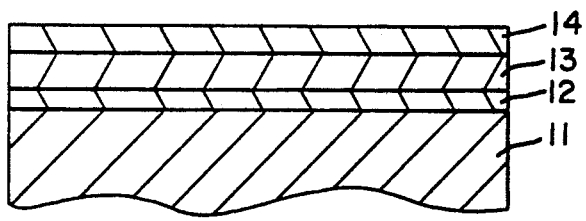
FIG.IC
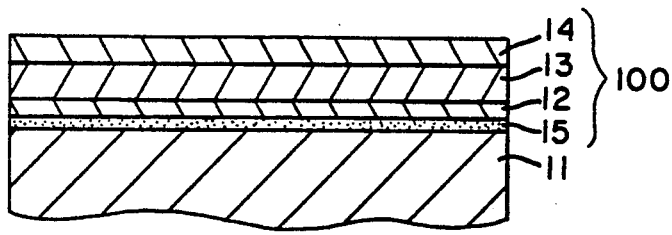
FIG.ID

METHOD OF PRODUCING A METALLIZATION LAYER STRUCTURE

This is a division of application Ser. No. 235,595 filed Aug. 24, 1988, U.S. Pat. No. 4,980,239.

BACKGROUND OF THE INVENTION

The present invention generally relates to a metallization for aluminum nitride ceramics having properties of a low thermal expansion and a high thermal conductivity. More particularly, the present invention relates to a metallization layer structure formed on aluminum nitride ceramics and a method of producing the metallization layer structure on the aluminum nitride ceramics.

Conventionally, alumina ($Al_2O_3$) ceramics, or a material of an oxide system such as glass containing silicon dioxide ($SiO_2$) as a major component, are used as structural elements of various electronic devices such as packages of semiconductor integrated circuit devices. Normally, there is a need for fixedly fastening an structural part such as a pin for an external connection to alumina ceramics or glass of the oxide system. Conventionally, a metallization is employed such that a metallization layer is formed on alumina ceramics or glass of the oxide system. The metallization layer functions as an adhesive layer, so that structural parts can be fixedly fastened to alumina ceramics or glass of the oxide system. Normally, chromium (Cr), titanium (Ti) or aluminum is used as a material for the metallization with respect to alumina ceramics or glass of the oxide system. Structural parts are mounted on the metallization layer formed alumina ceramics or glass of the oxide system, and are then soldered or brazed. The above metallization has been disclosed in the Japanese Laid-Open Patent Application Nos. 79910/1978, 207691/1984 and 57997/1985, for example.

Recently, there has been considerable activity in use of aluminum nitride (AlN) ceramics as ceramics having properties of a small thermal expansion coefficient and a high thermal conductivity, compared with $Al_2O_3$ ceramics. The thermal conductivity of AlN ceramics is also smaller than that of glass of the $SiO_2$ system. AlN ceramics have a thermal expansion coefficient of $4 \times 10^{-6}/°C.$, which is about half the thermal expansion coefficient of $Al_2O_3$ ceramics, or $7 \times 10^{-6}$. The thermal conductivity of AlN ceramics is three to eight times that of $Al_2O_3$ ceramics, and is also more than one thousand times as large as that of $SiO_2$ glass.

However, the Cr, Ti or Al metallization layer does not have a sufficient adhesive strength with respect to AlN ceramics of the non-oxide system. Therefore, the conventional metallization layer may be broken away from AlN ceramics. This lead to degradation in a hermetic seal of a package, for example.

SUMMARY OF THE INVENTION

Accordingly, a general object of the present invention is to provide a novel and useful metallization layer structure formed on aluminum nitride ceramics and a method of producing the metallization layer structure in which the disadvantages of the prior art are overcome.

A more specific object of the present invention is to provide a metallization layer structure formed on aluminum nitride ceramics and a method of producing the metallization layer structure having a sufficient adhesive strength.

Another object of the present invention is to provide a metallization layer structure formed on aluminum nitride ceramics and a method of producing the metallization layer structure capable of providing an improved reliability of fastening of structural parts with respect to AlN ceramics.

The above objects of the present invention are achieved by a metallization layer structure formed on AlN ceramics including the following layer structures. An intermediate layer is formed on an aluminum nitride ceramics base. The intermediate layer contains aluminum titanium nitride. A titanium layer is formed on the aluminum titanium nitride layer. A heat-resistant metallic layer is formed on the titanium layer. metallic layer for facilitating soldering or brazing is formed on the heat-resistant metallic layer.

The above objects of the present invention are also achieved by a method of producing the above metallization layer structure including the steps of forming a titanium layer on an aluminum nitride ceramics base; forming a heat-resistant metallic layer on the titanium layer; forming a metallic layer on the heat-resistant metallic layer; subjecting the laminated layers to a heat treatment at a temperature within a predetermined range sufficient to generate an aluminum titanium nitride layer between the aluminum nitride ceramics base and the titanium layer.

A further object of the present invention is to provide a method of producing a patterned metallization layer structure on aluminum nitride ceramics.

The above further object of the present invention is attained by a method comprising the steps of forming a titanium layer on an aluminum nitride ceramics base; forming a heat-resistant metallic layer on the titanium layer; forming a metallic layer on the heat-resistant metallic layer; subjecting the laminated layers to a first heat treatment at a temperature lower than a temperature sufficient to form an aluminum titanium nitride layer between the aluminum nitride ceramics base and the titanium layer; patterning the laminated layers by etching; and subjecting the patterned layers to a second heat treatment at a temperature within a range sufficient to generate the aluminum titanium nitride layer between the aluminum nitride ceramics base and the patterned titanium layer.

Other objects, features and advantages of the present invention will become apparent from the following detailed description when read in conjunction with the accompanying drawings.

BRIEF DESCRIPTION OF THE DRAWINGS

FIGS. 1A through 1D are elevational cross sectional views for explaining the steps of a preferred embodiment of the present invention;

DETAILED DESCRIPTION OF PREFERRED EMBODIMENTS

Figure 2A:
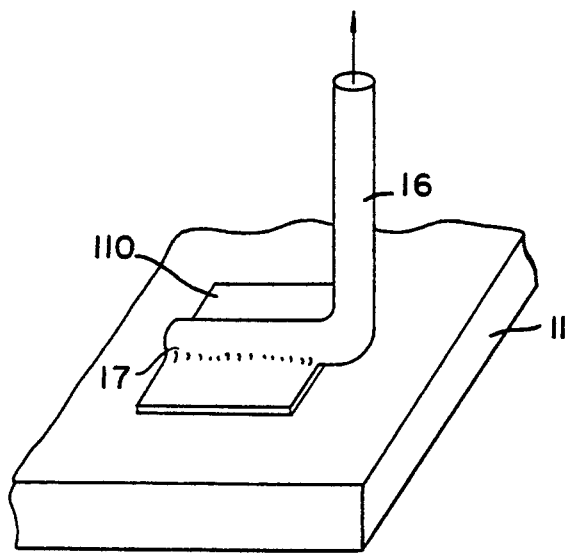
FIGS. 2A through 2C are views for explaining a text for measuring an adhesive strength of a metallization layer structure produced by the preferred embodiment of the present invention.

A description is given of a preferred embodiment of the present invention with reference to FIGS. 1A through 1D.

Referring to FIG. 1A, a titanium (Ti) thin film layer 12 is formed on an aluminum nitride (AlN) ceramics base 11 by a conventional process such as conventional vacuum evaporation or sputtering. The AlN ceramics base 11 may be produced by a conventional process comprising the steps of forming an AlN powder to obtain a body having a desired shape, sintering the formed AlN tase and burning the sintered AlN base. An AlN powder can be obtained by a method of directly nitrifying Al ($2Al + N_2 \rightarrow 2AlN$), a method of reducing carbon with respect to an aluminum compound such as $Al_2O_3$ and $Al(OH)_3$ ($Al_2O_3 + 3C + N_2 \rightarrow 2AlN + 3CO$), a gas phase reaction method of reacting a halogenide compound of Al and hydrogen nitride ($NH_3$). The AlN ceramics base 11 may be a single layer structure or a multilayer structure where a plurality of AlN plates are elevationally laminated. The Ti thin film layer 12 must have a thickness of at least 0.1 [μm], preferably 0.5 [m] in order to cover convex and recess portions on the surface of the AlN ceramics base 11 to thus obtain a flat top surface thereof. A temperature to be set during the step for forming the Ti thin film layer 12 may be within a range of 200 to 250 [°C.].

Next, as shown in FIG. 1B, a heat-resistant metallic layer 13 made of a heat-resistant metallic material such as tungsten (W) and molybdenum (Mo) is formed on top of the Ti thin film layer 12 by a conventional method such as vacuum evaporation and sputtering. The heat-resistant metallic layer 13 may be 1 to 5 [μm] in thickness. Subsequently, as shown in FIG. 1C, a nickel (Ni) layer 14 having a thickness of 0.5 to 2.0 [μm] is formed on top of the heat-resistant metallic layer 13 by a conventional method such as vacuum evaporation and sputtering.

Then, the layer structure of FIG. 1C is heated into a non-oxiding atmosphere, preferably a reducing atmosphere such as a hydrogen gas. The heat treatment is carried out at a temperature within a range of 850 to 1000 [°C.] for 40 [min]. Thereby, as shown in FIG. 1D, an intermediate layer 15 having a composition of aluminum titanium nitride ($Al_xTi_{1-x}N$) is formed in an interface between the AlN ceramics base 11 and the Ti thin film layer 12. This temperature range set during the heat treatment is a very important factor for producing the AlTiN intermediate layer 15, as described in detail later. The AlTiN intermediate layer 15 may be equal to or smaller than 1000 [Å] in thickness. In this manner, a metallization layer 100 made up of the AlTiN layer 15, the Ti thin film layer 12, the heat-resistant metallic layer 13, and the Ni layer 14 is formed on the AlN ceramics base 11. The presence of the AlTiN intermediate layer 15 contributes to improving the adhesive strength of the metallization layer 100.

The Ni layer 14 is a layer necessary for fastening a member such as a metallic member to the AlN ceramics base 11 by soldering or brazing using silver. The heat-resistant metallic layer 13 is provided for the purpose of preventing the interdiffusion between the Ti thin film layer 12 and the Ni layer 14. It is to be noted that in case where the interdiffusion between the Ti thin film layer 12 and the Ni layer 14 occurs, the AlTiN intermediate layer 15 cannot be produced. Therefore, in such a case, it is impossible to obtain a metallization layer having an increased adhesive strength.

Figure 2B:
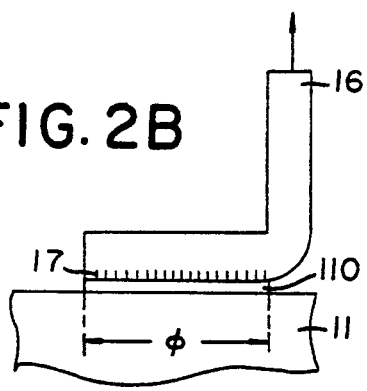
Figure 3A:
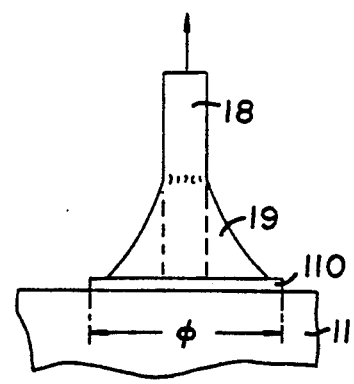
FIGS. 3A and 3B are views for explaining the text for measuring an adhesive strength of the metallization structure produced by the preferred embodiment of the present invention.
Figure 2C:
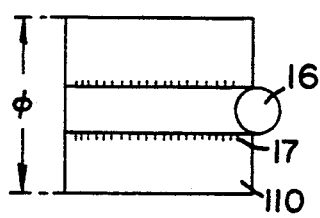
Figure 3B:
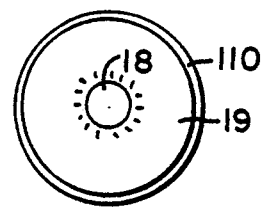

The present inventors verified the adhesive strength of the metallization layer 100 with respect to the AlN ceramics base 12 by methods shown in FIGS. 2A through 2C, and 3A and 3B. FIGS. 2A through 2C are with respect to an L-shaped tensile strength test, and FIGS. 3A and 3B are with respect to an elevational tensile strength test. A plurality of samples shown in FIGS. 2A through 2C were used in the test. A pad 110 of each of the samples is a patterned metallization layer, which can be obtained by a method described in detail later. The pad 110 having a size of 2.0 [mm$^2$] was used in the test. A tinning copper wire 16 of an L-shaped cross section was soldered on the pad 110 with a PbSn solder in the state where a peripheral portion of the wire 16 makes contact with the pad 110. The wire 16 was 0.80 [mm] in diameter. The solder used in the test had a melting point of approximately 200 [°C.]. A solder portion is indicated by a reference numeral 17. The wire 16 was tensed in a direction indicated by an arrow, and a force necessary for the pad 110 to be broken away was measured. In the test, samples shown in FIGS. 3A and 3B were also used. A tinning copper wire 18 having a diameter of 0.80 [mm] was soldered on the pad 110 so that an end thereof makes contact with the pad 110. The solder used in the test had a melting point of approximately 200 [°C.]. A solder portion is indicated by a reference numeral 19. The wire 18 was tensed in a direction of an arrow, and a force necessary for the pad 110 to be broken away was measured.

Figure 4:
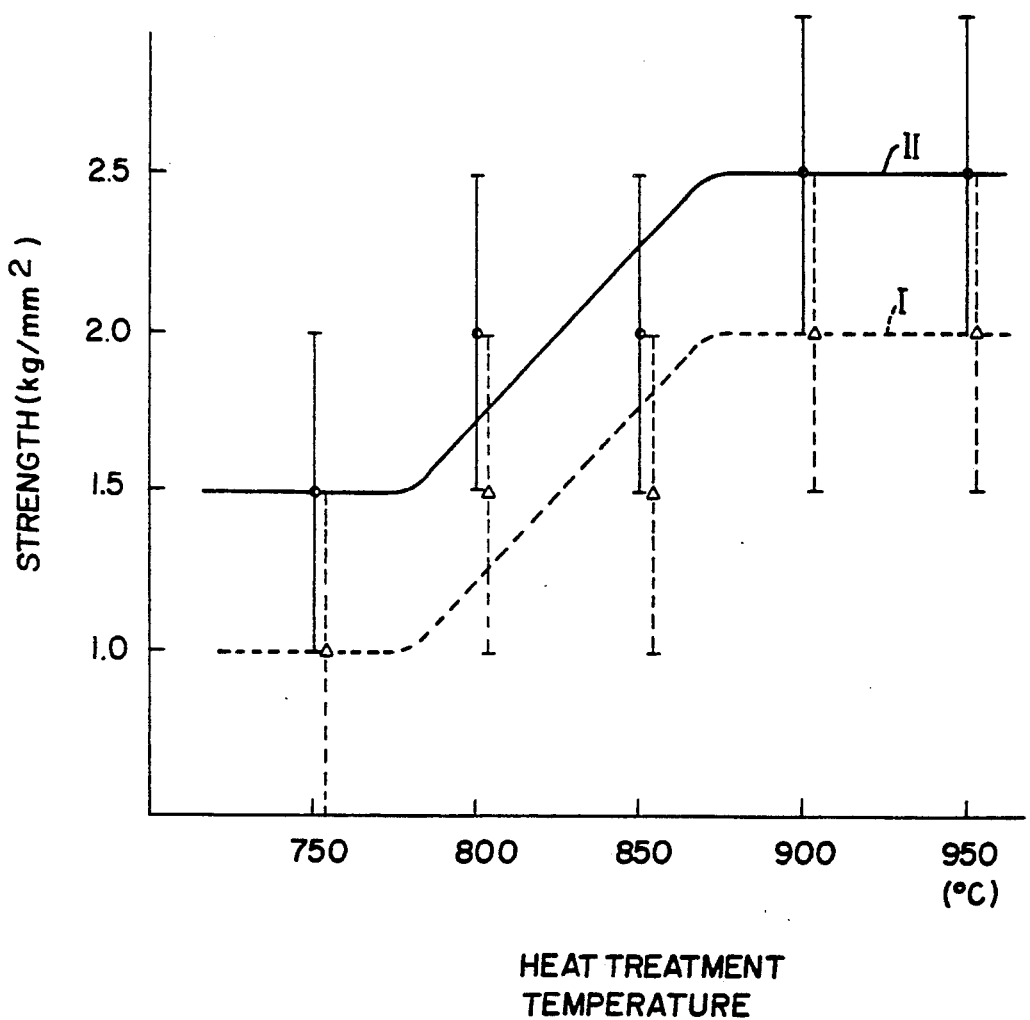
FIG. 4 is a graph for explaining a preferable temperature range to be used in a heat treatment step.

FIG. 4 shows the measurement results, where a broken line I is with respect to the L-shaped tensile test shown in FIGS. 2A through 2C, and a solid line II is with respect to the vertical tensile test shown in FIGS. 3A and 3B. A horizontal direction of the graph denotes a heat treatment temperature [°C.], and a vertical direction thereof denotes a force [kg/mm$^2$] necessary for pad 11 to be broken away, which can be defined as an adhesive strength. Measured values of the strength with respect to the L-shaped tensile test and the vertical tensile test are plotted with symbols Δ and ○, respectively. The curved lines I and II are obtained by appropriately tracing the symbols Δ and ○, respectively. It can be seen from the graph that the adhesive strength measured at a heat treatment temperature equal to or lower than approximately 810 [C.] has a value equal to or smaller than 1.5 [kg/mm$^2$]. When the heat treatment temperature is equal to 850 [°C.], the measured adhesive strength is definitely more than 1.5 [kg/mm$^2$]. Further, when the heat treatment temperature was equal to 950 [C.], the measured adhesive strength was equal to 2.0 [kg/mm$^2$]. It has been confirmed that although not shown in the graph, this value of the adhesive strength, 2.0 [kg/mm$^2$] is substantially kept up to a temperature of approximately 1100 [°C.] or over. However, when the temperature during the heat treatment is around 1100 [°C.], a phenomenon becomes great such that the surface of the AlN ceramics base is oxidized due to the presence of residual oxygen. Therefore, the heat treatment should not be performed at a temperature more than about 1100 [°C.]. It may be therefore concluded that it is preferable to carry out the heat treatment within a temperature range of 850 to 1000 [°C.]. When the layer structure shown in FIG. 1C is subjected to the heat treatment within the above temperature range, the metallization layer structure shown in FIG. 1D can be obtained. As described before, the presence of the AlTiN intermediate layer 15 contributes to improving the adhesive strength of the metallization layer formed on the AlN ceramics base 11. In other words, if the layer structure of FIG. 1C is subjected to the heat treatment without the above temperature range, the AlTiN intermediate layer 15 cannot be effectively produced.

The presence of the AlTiN intermediate layer 15 can be confirmed by etching using a mixed acid containing a fluorine acid and a phosphoric acid. If the AlTiN intermediate layer 15 has not been produced, the surface of the AlN ceramics base 11 becomes exposed with a relatively short etching time. On the other hand, if the AlTiN intermediate layer 15 has been produced, an extremely long time is taken to obtain the exposed surface of the AlN ceramics base 11.

Figure 5A:
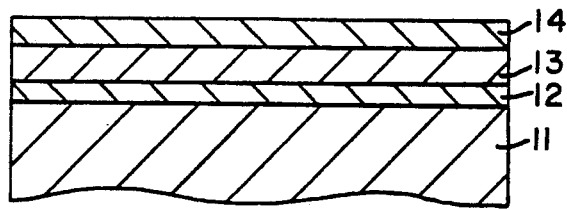
FIGS. 5A through 5C are elevational cross sectional views for explaining the steps of another preferred embodiment of the present invention.
Figure 5B:
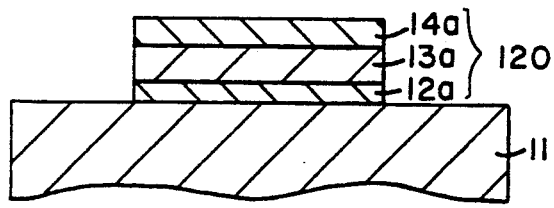

It is possible to obtain a patterned metallization layer on the AlN ceramics base 11. This is described by referring to FIGS. 5A through 5C. After obtaining the trilayer consisting of the Ti thin film layer 12, the heat-resistant metallic layer 13 and the Ni layer 14 as shown in FIG. 5A identical to that shown in FIG. 1C, the AlN ceramics base 11 is subjected to a low-temperature heat treatment at a temperature of 700 to 900 [°C.] in a non-oxiding atmosphere, preferably a reducing atmosphere such as a hydrogen gas. Then the metallization layer 100 is subjected to a conventional patterning process in which an etching liquid containing a mixed acid of a fluorine acid and a phosphoric acid is used. Thereafter, the AlN ceramics base 11 on which a patterned metallization layer 120 consisting of a patterned Ti thin film layer 12a, a patterned heat-resistant metallic layer 13a and a patterned Ni layer 14a is subjected to a heat treatment at a high temperature within a range of about 850 to 1000 [C.].

The above low-temperature heat treatment allows some Ti atoms in the Ti thin film layer 12 to be diffused into the AlN ceramics layer 11, so that a strong coupling between the AlN ceramics base 11 and the Ti thin film layer 12 can be established. For this reason, it is preferable to perform the patterning step after the low-temperature heat treatment is carried out. Additionally, if the high-temperature heat treatment using a temperature of 850 to 1000 [°C.] is performed without carrying out the low-temperature heat treatment for the layer structure of FIG. 1C, a very long etching time is taken to etch the AlTiN intermediate layer 15. As a result, the trilayer structure on the AlTiN intermediate layer 15 may be over-etched, are thereby the adhesive strength of the metallization layer 100 may be reduced. The high-temperature heat treatment must be performed after the patterning step.

On the other hand, it is not preferable to set a heat treatment temperature lower than approximately 700 [°C.] in the low-temperature heat treatment. This is because side etching with respect to the Ti thin film layer 12 is great, so the metallization layer 100 may be broken away from the metallization layer after the high-temperature heat treatment. The above causes the reliability of the adhesive property to be degraded.

A description is given of applications of the present invention.

Figure 6A:
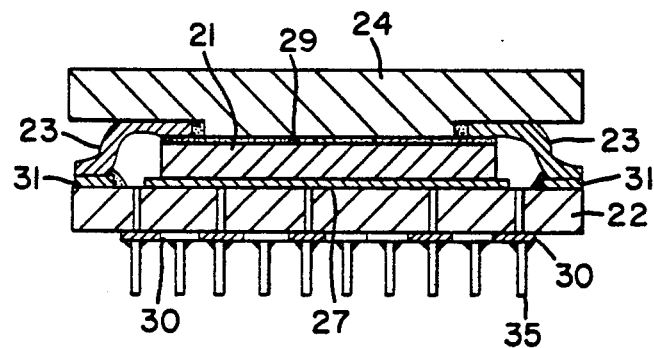
FIGS. 6A through 6C are views showing a semiconductor device which is an application of the present invention.
Figure 6B:
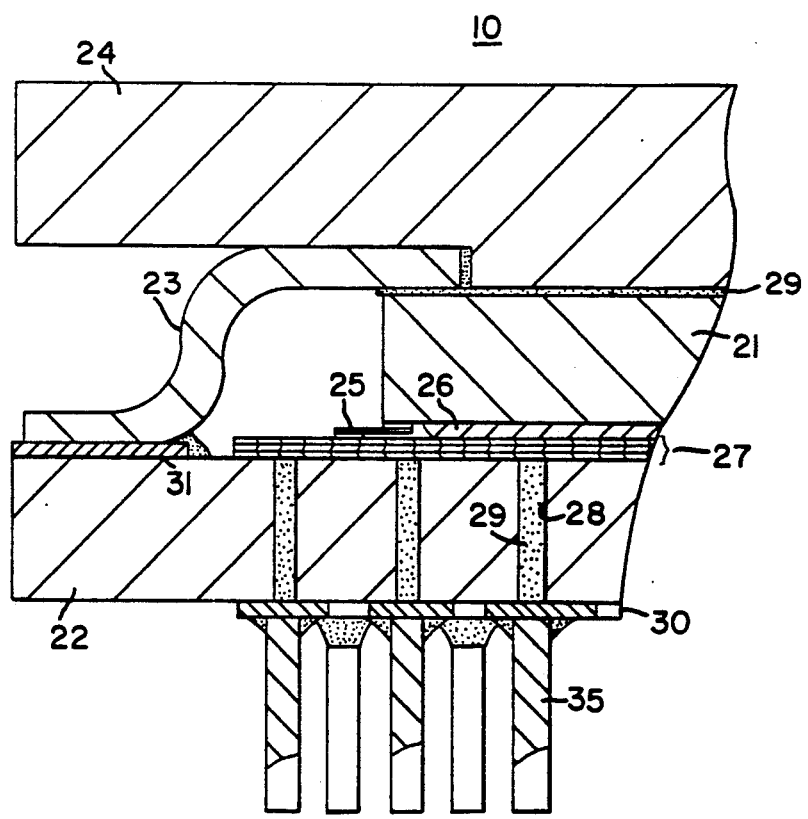
Figure 6C:
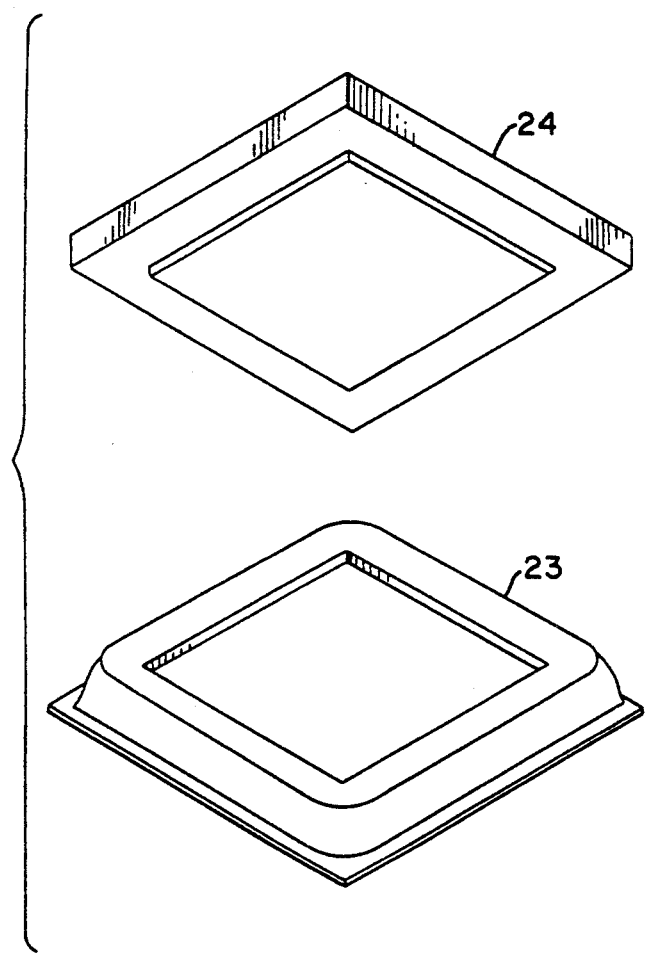

A semiconductor device shown in FIGS. 6A through 6C is a device obtained by applying the present invention to the device disclosed in the U.S. Pat. No. 4,698,663, the assignee of which is the same as the assignee of the present invention. As shown, the illustrated semiconductor device generally includes a semiconductor element 21 such as a silicon chip, an AlN ceramics base 22, a cap 23 and a heatsink member 24. A plurality of minute leads 25 extend outwardly from a periphery of a top face 21a and a polyimide resin layer 26. The semiconductor chip 21 is placed face downward on a multilevel interconnection layer 27 which is formed on top of the AlN ceramics base 22. The semiconductor chip 21 is electrically and mechanically coupled to the multilevel interconnection layer 27 without the use of wires.

Figure 5C:
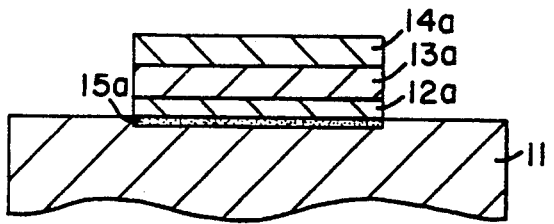

There are formed a plurality of via holes 28 which penetrate the AlN ceramics base 22. A metal 29 such as Mo and W is filled into the via holes 28 and is metallized. Patterned metallization layers 30 each having the same structure as that shown in FIG. 5C are formed on the bottom surface of the AlN ceramics tase 22. Each of the patterned metallization layers 30 is provided for the respective pins 35, and acts as an adhesive layer for fastening pins 35 to the AlN ceramics base 22. The pins 35 are soldered on the respective metallization layers 30. As described before, the presence of the metallization layers 30 can provide an improved adhesive strength. Similarly, a patterned metallization layer 31 having a layer structure identical to that shown in FIG. 5C is formed on a peripheral portion of the top surface of the AlN ceramics base 22. The patterned metallization layer 31 acts as an adhesive layer which can provide an improved adhesive strength and an improved hermetical seal. The cap 23 are fixedly soldered on the AlN ceramics base 22, so that the semiconductor chip 21 can be hermetically sealed and packaged. Further, the semiconductor chip 21 are soldered on bottom surfaces of the cap 23 and the heatsink member 24 by a solder 29. In the case where the heatsink member 24 is made of AlN, a metallization layer as shown in FIG. 1D may be provided on bottom surface portions of the heatsink member 24 which correspond to positions of the cap 23 and heatsink member 24.

The above semiconductor device may be fabricated as follows. To begin with, the AlN ceramics base 22 is formed as the aforementioned process. Next, the via holes 28 are formed into the AlN ceramics base 22. Then a metal powder of Mo, W or the like is filled into the via holes 28. Then the AlN ceramics base 22 is sintered, so that the metal powder is sintered. Thereafter, the layer structure shown in FIG. 1C is formed on each of the top and bottom surfaces of the AlN ceramics base 22. Then, the formed layer structures are subjected to the low-temperature heat treatment and then patterning process in the processes described previously. After that, the patterned layer is further subjected to the high-temperature heat treatment described before, so that the patterned metallization layers 30 and 31 each having the same structure as that shown in FIG. 5C are formed. Then pins 35 are soldered on the corresponding patterned metallization layers 30.

Next, the multilayer interconnection layer 27 is formed on the top surface of the AlN ceramics base 22. Thereafter, the semiconductor chip 21 is mounted on top of the multilayer interconnection layer 27. Then a preformed solder is provided on top of the semiconductor chip 21 and then the cap 23 is placed so that a lower portion thereof is placed on the patterned metallization layer 31, and an upper portion thereof engages with the peripheral portion of the semiconductor chip 21 on which the preformed solder is formed. Thereafter, the heatsink member 24 is mounted as shown in FIG. 6B. Then the device is subjected to the heat treatment where a temperature is set equal to 300 to 330 [C.].

Figure 7:
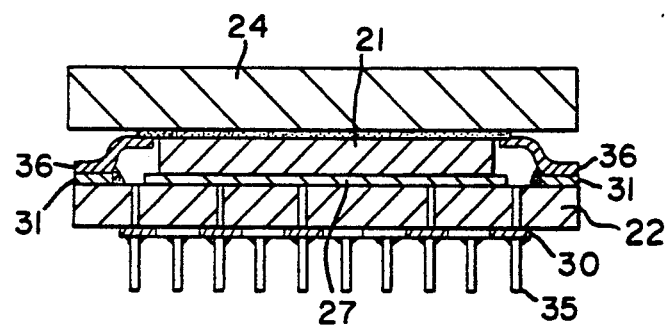
FIGS. 7 and 8 are cross sectional views of semiconductor devices which are applications of the present invention.

FIG. 7 is another semiconductor device using the metallization layers provided by the present invention. The pins 35 are mounted on the metallization films 30 formed on the AlN ceramics base 22. A cap 36 is mounted on the metallization layer 31 formed on the peripheral portion of the top surface of the AlN ceramics base 22. As shown, the cap 36 is separated from the semiconductor chip 21, and therefore stresses produced in soldered portions may be simplified, compared to the semiconductor device of FIGS. 6A through 6C where the cap 23 engages directly with the semiconductor chip 21.

Figure 8:
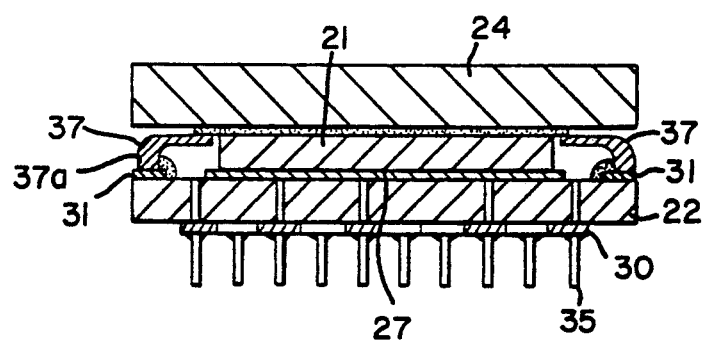

FIG. 8 shows yet another semiconductor device using the metallization layers 30 and 31 by the present invention. A cap 37 mounted on the metallization film 31 has an elevational portion 37a, and therefore the pressure tight of the cap 37 against the heatsink member 24 can be improved.

A further example of applications of the present invention is described below.

Figure 9:
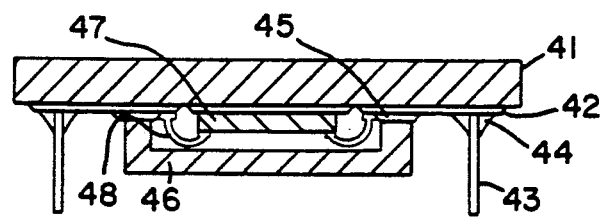
FIGS. 9 through 11 are cross sectional views of semiconductor devices which are applications of the present invention.

Referring to FIG. 9, patterned metallization layers 42 each identical to the layer structure of FIG. 5C are formed on a bottom (or top) surface of an AlN ceramics base 41. A plurality of straight pins 43 are soldered on the patterned metallization layers 42. A reference numeral 44 indicates a solder portion formed around an end of the pin 43. A seal member 45 made of glass is formed on the patterned metallization layers 42. A cap 46 is fixedly mounted on the metallization layer 42 through the seal member 45. A semiconductor chip (silicon chip, for example) 47 is fixedly mounted on the patterned metallization layer 42. A bonding pad formed on a surface of the semiconductor chip 47 is connected to the corresponding patterned metallization layer 42 by a bonding wire 48. In place of wire bonding, tape automatic bonding may be used. The semiconductor chip 47 is hermetically sealed by the cap 46.

Figure 10:
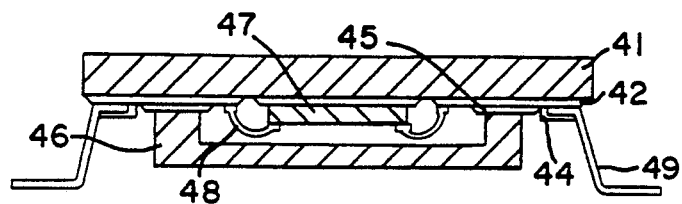

FIG. 10 shows a variation of the semiconductor device of FIG. 8. The device of FIG. 10 has pins 49, end portions of which extend horizontally. Other elements of the device of FIG. 10 are the same as those shown in FIG. 9.

Figure 11:
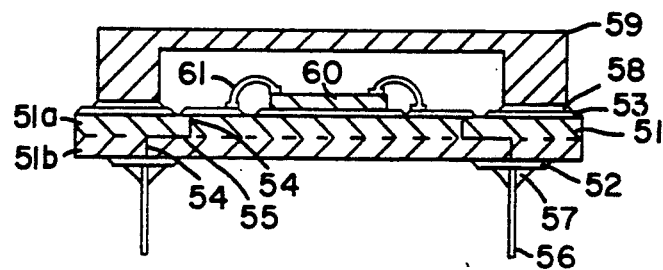

FIG. 11 shows a still further example of applications of the present invention. An AlN ceramics base 51 is made up of laminated base portions 51a and 51b. Each of the base portions 51a and 51b has via holes, which are filled with a metal 54. The via hole metal 54 in the upper base portion 51a may be connected to the corresponding via hole metal 54 in the lower base portion 51b by a pattern 55 formed in an interface therebetween. On the bottom surface of the AlN ceramics base 51, there are formed patterned metallization layers 52, on which pins 56 are soldered by a solder 57. Also, patterned metallization layers 53 are formed on the top surface of the AlN ceramics base 51. As shown, a semiconductor chip 60 is mounted on the patterned metallization layer 53, which is connected to the corresponding metallization layer 53 by a bonding wire 61. The metallization layer to which the bonding wire is connected, is also connected to the via hole metal 54 formed into the upper base portion 51a. The semiconductor chip 60 is hermetically sealed by a cap 59 soldered on the patterned metallization layer 53 by a solder 58.

The multilayer AlN ceramics base 51 having the multilayer structure may be applied to the semiconductor devices shown in FIGS. 6A, 6 and 7.

The present invention is not limited to the embodiments, and variations and modifications may be made without departing from the scope of the present invention.

What is claimed is:

1. A method of producing a laminated metallization layer structure on an aluminum nitride ceramic base comprising the steps of:
    laminating a titanium layer on an aluminum nitride ceramic base;
    laminating a heat-resistant metallic layer on the titanium layer;
    laminating a metallic layer on the heat-resistant metallic layer for facilitating soldering or brazing; and
    subjecting the laminated layers to a heat treatment at a temperature within a predetermined range sufficient to generate an aluminum titanium nitride layer between the aluminum nitride ceramic base and the titanium layer.

2. The method of claim 1, wherein the heat treatment is carried out in an atmosphere comprising a reducing gas.

3. The method of claim 2, wherein the reducing gas is a hydrogen gas.

4. The method of claim 1, wherein each of the steps of laminating the titanium layer, laminating the heat-resistant metallic layer and laminating the metallic layer is performed by one of vapor evaporation or sputtering.

5. The method of claim 1, wherein the heat-resistant metallic layer comprises a metal selected from the group consisting of tungsten and molybdenum, and wherein the metallic layer comprises nickel.

6. The method of claim 1, wherein the temperature used in the heat treatment step is within a range of 850° to 1000° C.

7. A method of producing a laminated metallization layer structure on an aluminum nitride ceramic base comprising the steps of:
    laminating a titanium layer on an aluminum nitride ceramic base;
    laminating a heat-resistant metallic layer on the titanium layer;
    laminating a metallic layer on the heat-resistant metal layer for facilitating soldering or brazing;
    subjecting the laminated layers to a first heat treatment at a temperature lower than a temperature sufficient to generate an aluminum titanium nitride layer between the aluminum nitride ceramic base and the titanium layer;
    subjecting the patterned layers to a second heat treatment at a temperature within a range sufficient to generate the aluminum titanium nitride layer between the aluminum nitride ceramic base and the patterned titanium layer.

8. The method of claim 7, wherein the etching step uses an etching liquid comprising a mixed acid of a fluorine acid and a phosphoric acid.

9. The method of claim 7, wherein the heat treatment is carried out in an atmosphere comprising a reducing gas.

10. The method of claim 9, wherein the reducing gas is a hydrogen gas.

11. The method of claim 7, wherein the temperature used in the second heat treatment step is within a range of 850° to 1000° C.

12. The method of claim 7, wherein the temperature used in the first heat treatment step is within a range of 700° to 800° C.

* * * * *